(12) United States Patent
Muendel

(10) Patent No.: US 9,042,423 B2
(45) Date of Patent: May 26, 2015

(54) BRIGHTNESS MULTI-EMITTER LASER DIODE MODULE AND METHOD

(71) Applicant: JDS Uniphase Corporation, Milpitas, CA (US)

(72) Inventor: Martin H. Muendel, Oakland, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 37 days.

(21) Appl. No.: 13/929,476

(22) Filed: Jun. 27, 2013

(65) Prior Publication Data

US 2015/0003484 A1    Jan. 1, 2015

(51) Int. Cl.
*H01S 5/14* (2006.01)
*H01S 5/40* (2006.01)
*H01S 5/10* (2006.01)

(52) U.S. Cl.
CPC ............... *H01S 5/4081* (2013.01); *H01S 5/14* (2013.01); *H01S 5/1025* (2013.01); *H01S 5/405* (2013.01)

(58) Field of Classification Search
CPC ......... H01S 5/1025; H01S 5/14; H01S 5/405; H01S 5/4081
USPC .............................................. 372/50.12, 102
See application file for complete search history.

(56) References Cited

U.S. PATENT DOCUMENTS

| | | | |
|---|---|---|---|
| 6,349,162 B1 | 2/2002 | Shiraishi et al. | 385/124 |
| 7,764,723 B2 | 7/2010 | Ovtchinnikov et al. | 372/50.12 |
| 2002/0118715 A1* | 8/2002 | Kimura et al. | 372/36 |
| 2007/0195850 A1* | 8/2007 | Schluter et al. | 372/50.124 |
| 2008/0131052 A1* | 6/2008 | Matsumura et al. | 385/33 |
| 2012/0033917 A1* | 2/2012 | Fortusini et al. | 385/72 |
| 2012/0069861 A1* | 3/2012 | Neuberger | 372/6 |

OTHER PUBLICATIONS

Mansuripur et al., "Optics of Semiconductor Diode Lasers", Optics & Photonics News, pp. 57-61, Jul. 2002.

* cited by examiner

*Primary Examiner* — Yuanda Zhang
*Assistant Examiner* — Michael Carter
(74) *Attorney, Agent, or Firm* — JDS Uniphase Corporation

(57) ABSTRACT

Improved brightness and feedback multi-emitter laser diode modules and methods are provided. A plurality of laser diode emitters emit broad-area light beams in a beam direction. In cross-section, each beam is broad in its slow axis and narrow in its fast axis. Groups of downstream optical components collimate, shape, stack and direct the beams along a light path towards a beam spot (which may be fiber-coupled). After collimating, stacking and directing, the beams are Fourier transformed in the fast-axis through a lens feature having a fast-axis focal length less than about 3 millimeters. In some embodiments, the fast-axis focal length is between about 0.1 and 2.0 millimeters. Astigmatism may be introduced between the fast axis and the slow axis in the beams upstream of the lens feature and in accordance with the fast axis focal length of the lens feature. The emitters may receive feedback including wavelength locking feedback.

26 Claims, 9 Drawing Sheets

BRIGHTNESS MULTI-EMITTER LASER DIODE MODULE AND METHOD

TECHNICAL FIELD

The present invention relates to multi-emitter laser diode modules and more particularly, to improving the brightness of the beam generated by such modules at launch.

BACKGROUND OF THE INVENTION

Maximizing brightness of laser diode modules is important for many applications, including pumping of fiber lasers and processing of materials directly with diode radiation. Even with many advances over recent years, fiber-coupled laser diode modules still do not reach their theoretically achievable brightness. This disclosure brings the brightness significantly closer to optimum.

A typical prior-art high-power multi-emitter multimode-fiber-coupled laser diode module 10 is illustrated in FIG. 1A and described, for example, in U.S. Pat. No. 7,764,723 issued Jul. 27, 2010 to Ovtchinnikov et al. ("the '723 patent"). At the most basic level, an array of diode emitters 12 output light beams 14 along a light path. In FIG. 1A, each individual diode emitter 12 in the array is stacked on top of the other. Various optics 16, 18, 20 and 22 collimate and shape the beam 14 of each emitter such that each light beam 14 is concentrated and directed into a single multi-emitter beam 19. The beam 19 is directed on the light path towards a fiber 30. The beam 19 generates a beam spot 36 at the location where the fiber facet 31 of fiber 30 may be located. As some multi-emitter laser diode modules 10 may not be fiber-coupled, the beam spot 36 is the launch point of the module 10. If the modules 10 are not fiber-coupled, then lens 22 is generally omitted. In a fiber-coupled module, as illustrated in FIG. 1A, the beam spot 36 is located at the fiber facet 31. As the fiber tip of fiber 30 is a flat surface in FIG. 1A, the fiber tip of fiber 30 is also the fiber facet 31.

Referring to FIG. 1A in greater detail, each broad-area laser diode emitter 12 emits a non-circular beam 14 in the beam direction. Each beam 14 is broad (about 50 to about 200 microns wide) in its slow-axis and narrow (about 1 to about 2 microns) in its fast-axis. The fast and slow axes are transverse to the direction of propagation of the beam. In FIG. 1A, the fast axis is in the x direction, the slow axis is in the y direction and the beam path is in the z direction. Each beam 14 is collimated and shaped by fast-axis collimator 16 and slow-axis collimator 18 to form a wide, vertically thin collimated beam 15. Multiple beams 15 may be stacked in the fast-axis direction (vertically in the x direction in FIG. 1A) from the plurality of diode emitters 12 by a set of mirrors 20 that are slightly offset in the fast-axis direction.

As a result, the multi-emitter laser diode module 10 launches into objective lens 22 a fast-axis-stacked set of thin, wide beams 19 that together fill a region of the objective lens 22. The beams 19 are then focused by objective lens 22 on a beam spot 36 and may be coupled into an output fiber 30 through a fiber entrance facet 31.

A key benefit of the prior-art diode module 10 illustrated in FIG. 1A is that it can achieve relatively high brightness compared to other multimode-fiber-coupled diodes. Brightness is defined as the output power per output cross-sectional area per output solid angle and expressed as watts per square cm per steradian. The same information can also be conveyed by specifying the power in watts and the beam-parameter products (BPPs) in the two orthogonal dimensions transverse to the beam direction. The BPP is defined as the product of beam radius and half-divergence angle in a given transverse dimension and is expressed in mm-mrad. For a fiber 30 with a standard circular core (such as in FIG. 1B), the beam radii and the divergences in the two transverse dimensions equilibrate quickly, thus making the two BPPs equal. To maximize brightness for a given level of power, one needs to minimize the BPPs.

Most multimode-fiber-coupled diodes have relatively poor brightness, i.e. high BPP, because broad-area diode emitters have very asymmetric BPPs in the two transverse dimensions. In the fast axis, these emitters are diffraction-limited, i.e. single-moded, which for a wavelength in the 0.9-1.0 micron range means a BPP of about 0.3; whereas in the slow axis, these emitters are highly multimode, with a width of typically 100 microns and a half-divergence of typically 0.1 radians, giving a BPP of about 5 in this dimension. In existing multi-mode fiber-coupled diode modules, the BPP is degraded because the modules must accommodate long tails in the near-field profile. Even though anamorphic optics such as prisms and cylinder lenses are able to alter spot sizes and divergences in one axis and not the other, the unfavorable BPPs do not change in either axis.

As a result, regardless of the use of typical optics, the beam 19 launched into the fiber 30 still generally has very asymmetric BPPs. This means that the beam 19 is either asymmetric in the near field (the spatial distribution of the power at the beam spot 36 or fiber entrance facet 31 in the two dimensions), or asymmetric in the far field (the angular distribution in the two dimensions), or both. In the near field, the launched light will quickly spread out in both dimensions to fill the transverse size of the fiber core 32, losing brightness corresponding to however much the facet 31 was initially under filled by the beam. In the far field, the angular distributions of the light in the two dimensions will rapidly mix and yield a net divergence that is a mean between the divergences in the two initial dimensions but is weighted toward the higher divergence. In a circular-core fiber 30 as illustrated in FIG. 1B, if a beam with initially asymmetric BPPs is launched, regardless of whether the asymmetry is manifested in the near field or far field or both, the resultant equilibrated BPP will necessarily be worse (higher) than the average of the initial BPPs, and there will be a net loss of brightness.

In order to achieve high brightness in a circular-core fiber 30, it is important to have roughly equal BPP's in the two dimensions prior to launching into the fiber 30, with a relatively symmetric beam in the two dimensions in both the near field and the far field; and the near-field spot 36 should be sized to fill the fiber core 32 as well as possible, as shown in FIG. 1B. Diode module designs such as that illustrated in prior-art FIG. 1A, or similar to the '723 patent, achieve this through stacking a number of collimated beams 15 from the multiple emitters 12 in the vertical dimension (corresponding to the fast axis of the diodes 12, and the x-axis in FIG. 1A) with the appropriate height per beam 15 so that the spot on the objective lens 22 is roughly square. As a result, after the beams 19 are focused by the lens 22 onto the beam spot 36 or into output fiber 30, the light would have roughly equal divergence in the horizontal and vertical directions. Also, the magnifications in the two dimensions are chosen so that the beam spot 36 on the fiber facet 31 is roughly square and fills the fiber facet 31 as well as possible. Therefore, the BPPs in the two dimensions are roughly equal, and the amount of brightness that is lost after the light equilibrates in the fiber 30 is minimized. The result is that this type of design has higher brightness than most other fiber-coupled diode designs.

However, in order to achieve the conditions necessary for even higher brightness, the design of these prior art diode modules is highly constrained because the number of emitters and their pitch are linked to the width of the emitters and the slow-axis divergence.

Furthermore, designs similar to the '723 patent still fall well short of the maximum theoretically achievable brightness. The reasons for decreased brightness include that the near-field spot 36 projected onto the fiber facet 31 is still rather poorly matched in both shape and power distribution to the fiber core 32, resulting in an under-filled aperture and subsequent brightness loss. This problem can be illustrated by directing one's attention to what is happening between the objective lens 22 and the fiber facet 31, inclusive, in region B of the prior-art design of FIG. 1A. A typical, non-limiting numerical example will also be used concurrently to further illustrate the problem and the solutions proposed in this disclosure.

Referring now to FIG. 1B, a cross-section of the fiber facet 31 of output fiber 30 of FIG. 1A along the line A is illustrated. A typical circular fiber 30 has a fiber facet 31 comprising a flat surfaced face at the beginning of the core 32 at the end of the optical cable. A fiber tip (not illustrated in FIG. 1A or 1B) may extend upstream of the fiber facet 31. A cladding 34 surrounds all of the fiber 30 except for the tip (if any) and fiber facets at both ends of the fiber 30. A typical circular fiber core 32 is 105 microns in diameter with a 125 micron cladding 34 and a numerical aperture (NA) of 0.22.

To improve brightness, the output fiber 30 should be illuminated with as large a beam spot 36 from the multi-emitter laser diode module 10 as possible in the near field, and thereby as low as possible divergence of light, typically 0.15 radians (half-divergence) or less. This substantially underfills the NA. Unlike in the near field, light in the far field in a fiber does not rapidly spread to fill the available aperture (0.22 NA in this case), so it is useful to launch with as small a divergence as possible (thus higher brightness) since this divergence will essentially be preserved and higher brightness will be present at the fiber output for the user's application.

FIG. 2A illustrates the beams 19 in the fast axis direction and shows near field intensity distribution 202 at the objective lens 22, near field intensity distribution 204 at the fiber facet 31 and far field intensity distribution 206 at the fiber facet 31. As with FIG. 1A, there is no tip on fiber 30, or alternatively, the fiber facet 31 is also the fiber tip.

Starting at the beam spot 36 which is co-located with the fiber facet 31 in FIG. 2A, the near-field intensity distribution 204 is a Gaussian-like distribution. The distribution is a magnified image of the near field of each laser diode emitter 12. The images of each of the emitters 12 is practically identical, so the final distribution (comprising all beams 15 superimposed over top of each other to form beam 19) is essentially the same as the image from any one emitter 12, barring any irregularities. A circular fiber core 32 having diameter of 105 microns can accommodate an inscribed square beam spot 36 of about 75 microns by about 75 microns. But in the fast-axis direction, because of the Gaussian-like distribution 204, the actual full-width-at-half maximum (FWHM) size 208 of the beam 19 must be much less than 75 microns in order to accommodate the long tails or gradually sloping edges of the distribution. If these tails were not accommodated, a considerable amount of power would be clipped at the fiber facet 31, resulting in poor power throughput as well as excessive heating and damage to the fiber. Typically, optics are chosen that provide an approximately 30 times magnification, so since the fast-axis beam height is typically about 1 micron at the emitter 12, the distribution at the fiber facet 31 or beam spot 36 is about 30 microns FWHM, and it can be calculated that the available core aperture of at least 75 microns in the fast axis direction will then capture about 99% of the power in the beam 19.

Still looking at the beam spot 36 and fiber facet 31 in the fast direction, the far-field intensity distribution 206 is a scaled copy of the near-field distribution 202 entering the objective lens 22 because the lens 22 acts as a Fourier transformer in both axes. Since the near field entering the objective lens 22 is where the multiple collimated beams 15 from the individual diode emitters 12 have been stacked side-by-side vertically to form beam 19, the summed intensity distribution 202 is a "top-hat" distribution with steep edges and a relatively flat top, as shown in FIG. 2A before the objective lens 22. With a fast-axis height 210 of about 3 mm (from vertically stacking the beams 15 from each emitter 12) and an objective lens focal length 212 of about 10 mm in both axes, the resulting far-field half-divergence 214 is about 0.15 radians and is uniformly filled.

Turning now to FIG. 2B, beam 19 in the slow axis direction is illustrated including near field intensity distribution 220 at the objective lens 22, near field intensity distribution 222 at the fiber facet 31 and far field intensity distribution 224 at the fiber facet 31. The 10 mm fast-axis and slow axis focal lengths 212 of the objective lens 22 are the same as in FIG. 2A.

Again starting at the fiber facet 31, in the slow-axis direction, the near-field intensity distribution 222 is an image of the wide axis of the emitters, which by the laterally multimode nature of the emitters tends naturally to be close to a steep edged top-hat distribution. Again, the wide-axis image of each emitter 12 is practically identical barring any irregularities, so the final distribution (comprising all beams 15 superimposed over top of each other to form beam 19) is essentially the same as the image from any one emitter 12. The magnification can be chosen such that the near-field width 226 at the fiber facet 31 is about 75 microns so that it fits into the 105-micron core. The far-field distribution 224 at the fiber facet 31 also corresponds to that of the emitters 12 and is close to Gaussian with gradually sloped edged and long tails. The far-field half-divergence at half maximum 228 is about 0.075 radians for typical diode emitters.

In the slow axis, it can be seen that the steep edged distribution 222 of the beam fills the available 75 micron aperture relatively uniformly and therefore efficiently, whereas in the fast axis, much of the 75 micron aperture is filled with the low-intensity tails and gradually sloped edges of the Gaussian distribution 224 of the beam and therefore the filling is about 50% efficient. Furthermore, even if the 75×75 micron inscribed square area was uniformly filled, this would still only fill 65% of the total aperture of the 105 micron circular fiber core 32 as illustrated in FIG. 1B. As a result, the total fill in this numerical example is about 33% efficient. Immediately after launch into the fiber 30, the light spreads out to fill the full aperture relatively uniformly, resulting in a drop in brightness of a factor of about 3.

A further drawback of the prior art occurs in applications where it is desired to provide an external feedback signal to the diode emitters. Such feedback can be used, for example, to ensure that the laser light generated by module 10 is at a tightly controlled wavelength. Conventional Fabry-Perot cavity diode emitters generate light with a center wavelength that is typically controlled only within several nanometers at best. Applications such as optical pumping and optical wavelength multiplexing, for example, often require sub-nanometer wavelength control. As is well-known in the art, it is possible to wavelength-lock a diode emitter by providing feedback preferentially at a desired wavelength, whereby most or all of the light generated by the laser diode is at the desired wavelength. This locking is typically achieved at some cost in output power, corresponding roughly to the power used in the feedback signal. Various techniques exist for providing this feedback, including using structures such as Bragg gratings etched directly in the emitter chip and using wavelength-selective partially reflective optics such as volume holographic gratings adjacent to one of the emitter facets. Although desirable for reasons including cost, reliability, stability, and wavelength precision, it has to date not been practical to lock the wavelength of the emitters 12 using feedback from a wavelength-selective optic situated downstream of a fiber 30 on a multi-emitter module 10. There are two reasons for this. First, as is well-known in the art, poor brightness performance of an optical assembly causes poor power efficiency in the reverse direction. Using the numbers in the above example, a drop in forward brightness by a factor of 3 implies, for backward-traveling power, a drop in power by 3×. Thus, if, for example, a wavelength-selective reflectivity of about 10% is required for reliable locking of a diode emitter, then a reflectivity of about 30% would be required in a wavelength-selective optic downstream of the fiber, resulting in an unattractively high cost of output power from the system. Second, when light is reflected back in the fiber of prior-art fiber-coupled modules and from there transmitted into individual emitters, it has been observed that the back-reflected power is non-uniformly distributed among the emitters, with the outlying emitters receiving the least amount of feedback. Since all of the emitters typically must be reliably locked, the required reflectivity of the downstream optic will be set by the weakest-locked emitter, and the surplus locking power provided to the other emitters will be wasted. The result is a further increase in the required reflectivity of the downstream optic.

As will be described below, the present disclosure teaches a modified design that improves the brightness that can be achieved at the beam spot 36 and immediately after launch into a fiber 30, if the multi-emitter laser diode module is fiber coupled. This design also enables, in fiber-coupled configurations, more efficient feedback to the emitters using downstream optics than is possible in prior-art designs.

SUMMARY OF THE INVENTION

The present disclosure improves the brightness performance of multi-emitter laser diode modules by modifying the optics to provide a more steeply sloped near-field intensity distribution in the fast axis at the beam spot (or fiber facet if the module is fiber-coupled). The numerical example commenced above is continued below to illustrate that when the design changes described below are implemented, in some embodiments there may be a roughly two times improvement in brightness over prior art multi-emitter laser diode module 10.

According to the present disclosure, a short focal length Fourier transform in the fast-axis can be introduced to transform the fast-axis near-field intensity distribution at the beam spot or fiber facet. The slow axis optics may remain relatively unchanged, may compensate for the additional fast-axis optics or may be transformed as well. As a result of the additional Fourier transform, the fast axis presents power intensity distributions having a steep sloped top-hat distribution in the near field and a Gaussian distribution in the far field. The steep sloped top-hat distribution in the fast-axis near field reduces the long tails that must be accommodated within the fiber core, better fills the aperture and increases brightness.

An embodiment of the present disclosure provides an apparatus comprising a plurality of laser diode emitters. Each emitter is provided for emitting a broad-area light beam in a beam direction. Each beam has a fast axis transverse to the beam direction and a slow axis transverse to both the beam direction and the fast axis. Each beam is broad in the slow axis and narrow in the fast axis. A group of optical components for each emitter are provided for collimating, shaping, stacking and directing the beams along a light path towards a beam spot. Each group is aligned downstream on the beam direction of the group's associated emitter. A lens feature is aligned on the light path downstream of the groups of optical components and upstream of the beam spot. The lens features has a fast axis focal length less than about 3 millimeters.

A further embodiment of the present disclosure provides a method for increasing the brightness of a multi-emitter laser diode module. The method comprises emitting a broad-area light beam from each of a plurality of laser emitters. Each beam travels in a beam direction. Each beam has a fast axis transverse to the beam direction and a slow axis transverse to both the beam direction and the fast axis. Each beam is broad in the slow axis and narrow in the fast axis. The method includes collimating and shaping the beams, stacking the beams in the fast axis and directing the beams along a light path towards a downstream beam spot. After collimating, stacking and directing the beams, the method includes Fourier transforming the beams in the fast-axis through a lens feature having a fast-axis focal length less than about 3 millimeters.

Another embodiment of the present disclosure provides a wavelength-locked fiber-coupled multi-emitter module. A plurality of laser diode emitters are provided. Each emitter emits a broad-area light beam in a beam direction. Each beam has a fast axis transverse to the beam direction and a slow axis transverse to both the beam direction and the fast axis. Each beam is broad in the slow axis and narrow in the fast axis. A group of optical components is provided for each emitter for collimating, shaping, stacking and directing the beams along a light path towards a beam spot. Each group is aligned downstream on the beam direction of the group's associated emitter. An output fiber is aligned on the light path downstream of the group of optical components having a tip aligned on the light path at the beam spot for receiving the beams. A two dimensional graded-index fiber lens is spliced on the tip having a fast axis focal length less than about 3 millimeters. A diffraction grating is aligned on the light path downstream of the lens with a reflector downstream of the diffraction grating. The diffraction grating and reflector provide for wavelength locking by providing a feedback signal upstream on the light path.

In some embodiments, the fast-axis focal length is between about 0.1 and about 2.0 millimeters. In some embodiments, the lens feature is provided for performing a fast-axis Fourier transform of the beams such that the edges of a fast axis near-field intensity distribution of the beams at the beam spot increase in steepness. In some embodiments, an objective lens is provided aligned on the light path downstream of the groups of optical components. In some embodiments means for creating astigmatism are provided between the fast and slow axes in the beams upstream of the lens feature in accordance with the fast axis focal length of the lens feature.

BRIEF DESCRIPTION OF THE DRAWINGS

Embodiments of the present disclosure are described with reference to the following figures wherein identical reference numerals identify identical or analogous elements.

DETAILED DESCRIPTION

While preferred embodiments may be illustrated or described, they are not intended to limit the invention. Rather, numerous changes including alternatives, modifications and equivalents may be made as would be understood by the person skilled in the art. Ultimately, the invention is defined by the appended claims.

The present disclosure improves the brightness performance of existing multi-emitter diode laser modules by modifying the fast-axis optics to include a short focal length fast axis Fourier transform before the beam spot (or fiber tip if the module is fiber-coupled). This improves how sharply or steeply the near field power intensity distribution in the fast axis slopes. Increasing the slope of the fast axis near-field intensity distribution is effected by an additional transforming lens feature performing an extra Fourier transform in the fast axis, so that a steep sloped top-hat distribution is presented in the fast-axis near field. Concurrently, a more gradually sloped or Gaussian distribution may be presented in the fast-axis far field, similar in power distribution to the near field output in the slow axis.

In some embodiments, the additional Fourier transform can be achieved by greatly demagnifying the large, stacked, top-hat-shaped fast axis beam at the objective lens and applying the effects of an additional fast cylinder lens feature between the objective lens and the beam spot or fiber facet. Accordingly, a top-hat shaped distribution, similar to that of the fast-axis far-field, is now presented in the fast-axis near field while a Gaussian distribution, similar to that of the fast-axis near-field, is now presented in the fast-axis far field. This makes a top-hat image that is matched into the fiber.

Because an additional Fourier transform is added in the fast axis dimension while passive propagation may occur in the slow axis direction, astigmatism between the fast and slow axis focal points may be introduced prior to the fast-axis Fourier transform so as to maintain focus on the beam spot or fiber tip (if any) after the additional Fourier transform. After the additional Fourier transform, the introduced astigmatism may be removed to return focus of the fast and slow axes to the beam spot. In some embodiments, an additional fast-axis Fourier transform can be achieved without astigmatism.

Figure 1A:
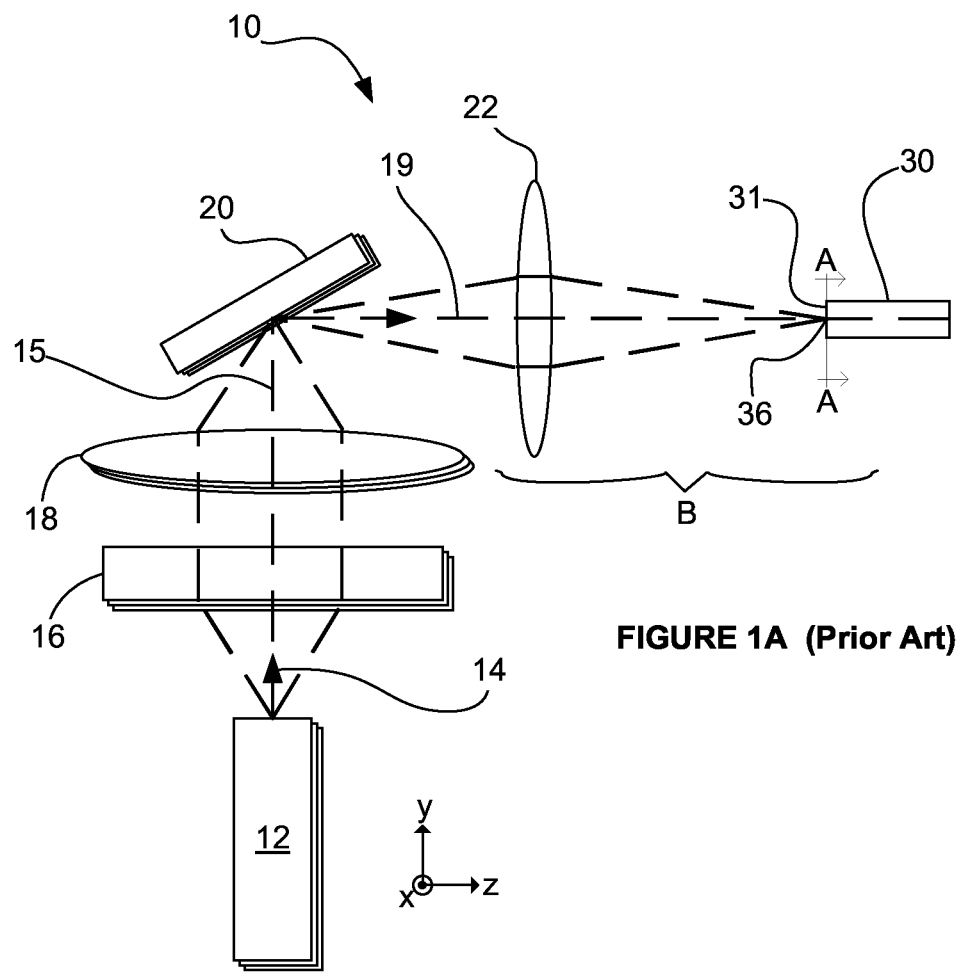
FIG. 1A is a perspective schematic illustration of a prior art multi-emitter fiber-coupled laser diode module.
Figure 3A:
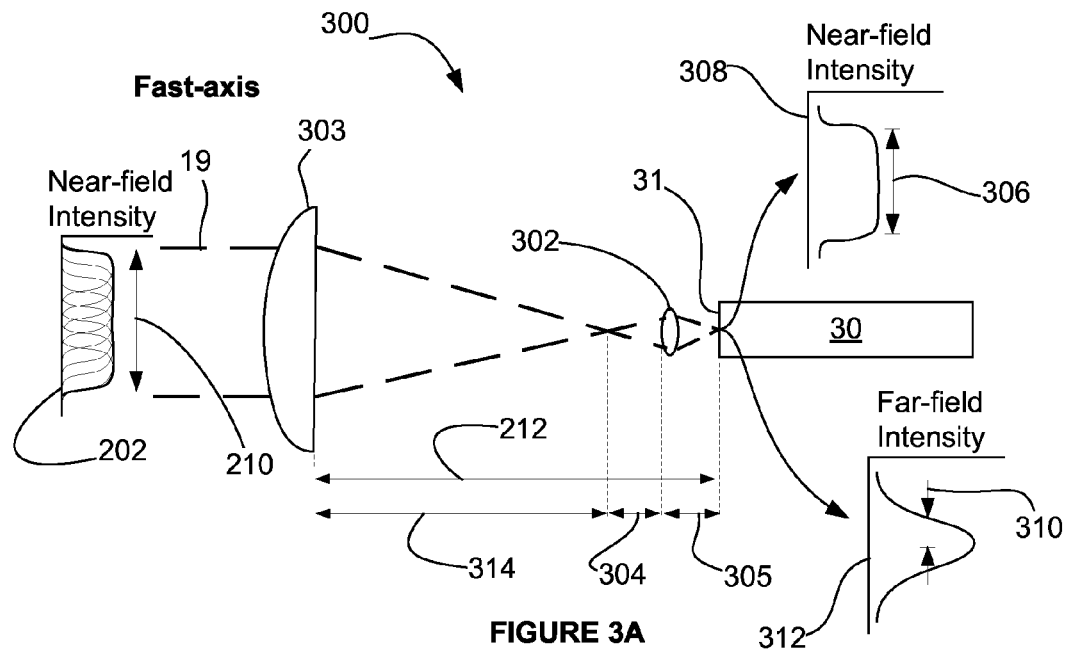
FIG. 3A illustrates an alternate configuration of region B of FIG. 1A in the fast axis according to the present disclosure including graphs of near and far field light intensity distributions at various points.
Figure 3B:
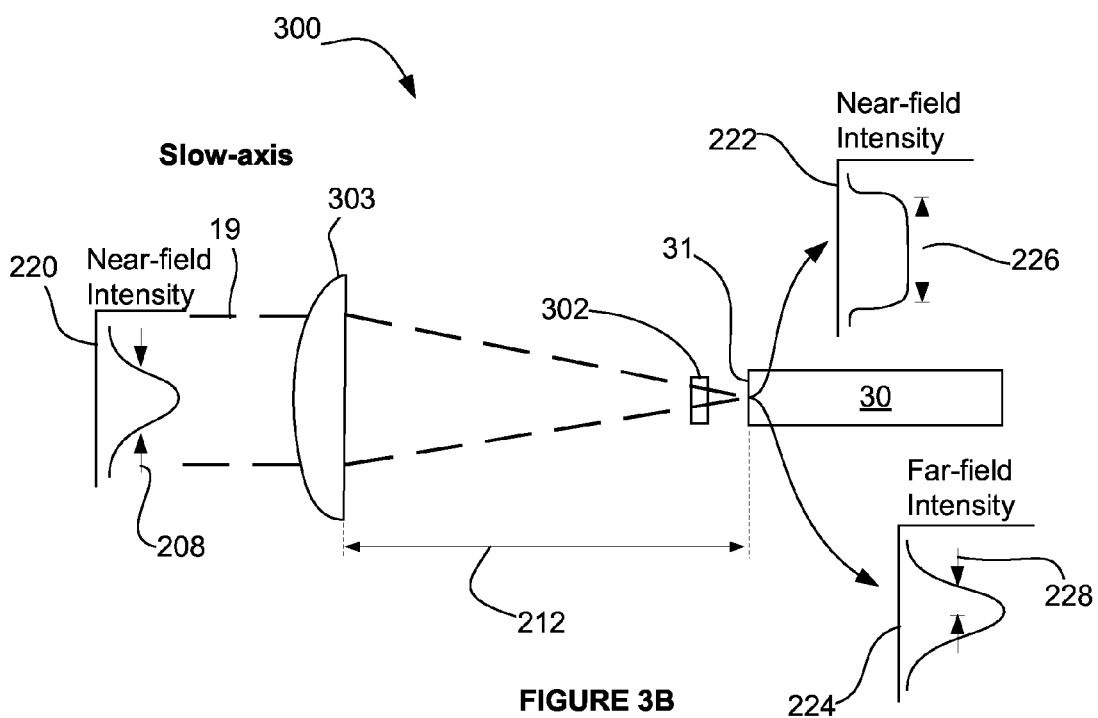
FIG. 3B illustrates the alternate configuration of FIG. 3A in the slow axis including graphs of near and far field light intensity distributions at various points.

Below, three non-limiting options are described implementing the above general principles while holding optical parameters in the slow axis, specifically the focal length of an optional objective lens, relatively constant. These three options are illustrated in FIGS. 3A and 3B, in FIGS. 4A and 4B and in FIGS. 5A and 5B. Instead of repeating all of the structure of known multi-emitter laser diode modules in each Figure, FIGS. 3A through 5B simply illustrate the modifications that would be performed to region B of the prior art multi-emitter laser diode module 10 described above and illustrated in FIG. 1A to implement improved brightness multi-emitter laser diode modules according to the present disclosure.

Referring now to FIGS. 3A and 3B, a first option 300 is illustrated in the fast axis and the slow axis respectively. An independent fast cylindrical lens 302 is inserted into the high-power multi-emitter multimode-fiber-coupled laser diode module 10 previously described in FIG. 1A to cause the desired additional fast-axis Fourier transform without changing the optics in the slow-axis. The objective lens 22 is replaced by a modified objective lens 303. The fast cylindrical lens 302 is inserted between the modified objective lens 303 and the fiber facet 31 such that the modified objective lens 303, fast cylindrical lens 302 and fiber facet 31 are aligned on the light path. The distance between the modified objective lens 303 and the front principal surface of cylindrical lens 302 is the sum of the fast-axis focal length 314 of the modified objective lens 303 and the fast-axis focal length 304 of the cylindrical lens 302. The free propagating distance 305 between the back principal surface of the cylindrical lens 302 and the fiber facet 31 is the fast-axis focal length of the cylindrical lens 302.

In some embodiments, the cylinder lens 302 may have a focal length 304 of 0.25 mm. Such lenses are commercially available and are typically used as fast-axis collimators for laser diodes. In order to perform the additional Fourier transform properly, the 0.25 mm focal length fast cylindrical lens' front principal surface should be located 0.25 mm downstream from the focus spot of the modified objective lens 303, and the back principal surface should be located 0.25 mm upstream of the fiber facet 31 such that the beam spot 36 appears on the fiber facet 31. In order to ensure stable alignment with the fiber facet 31, this lens 302 may be actively aligned and mounted directly to a ferrule (not illustrated)

holding the fiber 30. This mounting is appropriate for fiber-coupled multi-emitter laser diodes; however, other mountings are also possible where there is no fiber because the multi-emitter laser diode implementing this embodiment is not necessarily fiber-coupled.

Figure 2A:
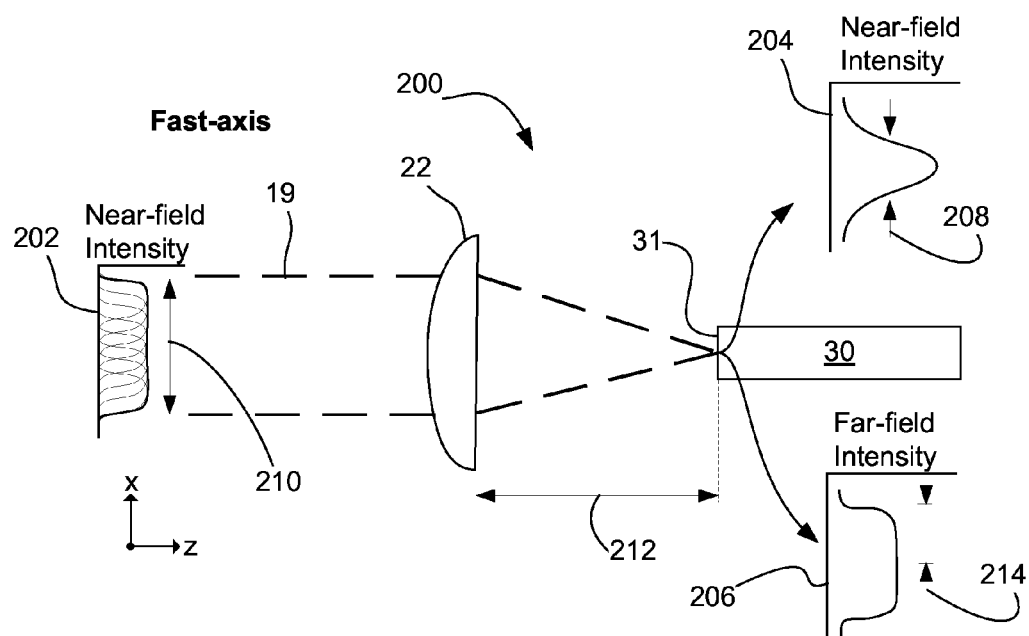
FIG. 2A is an exploded view of region B of FIG. 1A in the fast axis including graphs of near and far field light intensity distributions at various points.
Figure 2B:
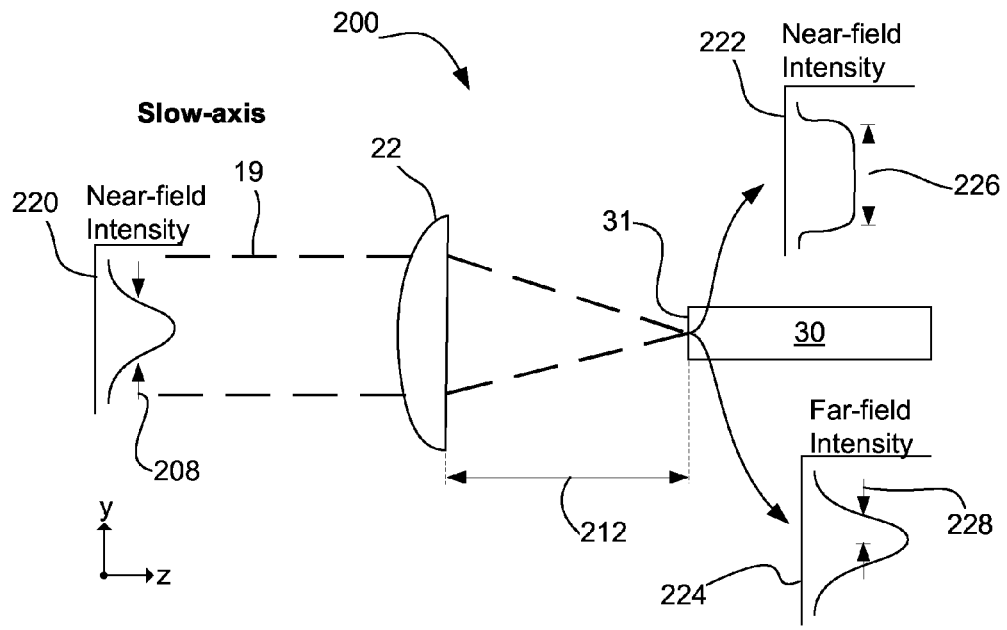
FIG. 2B is an exploded view of region B of FIG. 1A in the slow axis including graphs of near and far field light intensity distributions at various points.

Returning to the numerical example commenced in respect of FIGS. 2A and 2B, the result of applying the 0.25 mm (250 micron) lens 302 is to convert the former 0.15-radian half-divergence 214 top hat far field distribution 206 to a 2×250× 0.15=75-micron wide 306 top hat near field distribution 308, and to convert the former 30-micron wide FWHM 208 Gaussian near field distribution 204 to a 0.5*30/250=0.06-radian FWHM 310 Gaussian far field distribution 312. The brightness benefit of filling the near field 308 more uniformly is manifested in the improvement of the far field from a 0.15-radian top hat distribution 224 to a 0.06-radian FWHM Gaussian distribution 308 for a relative improvement in brightness of roughly a factor of 2.

In order to accommodate the cylinder lens 302 in FIG. 3A and hold the slow-axis optical parameters the same as before, the modified objective lens 303 replaced the prior-art objective lens 22. In the slow axis illustrated in FIG. 3B, the focus of the beam 19 must still be directly at the beam spot 36 or fiber facet 31, and, solely for easy of comparison of numerical examples, the slow-axis focal length of the objective lens 303 is held constant at 10 mm, the same as distance 212. Other configurations are equally possible, but this one is described to illustrate the relative increase in brightness that is achieved according to the present disclosure over the prior art numerical example.

Because the fast-axis cylinder lens 302 has been inserted, the objective lens's fast-axis focal point can be 0.50 mm in front of the fiber facet 31, and the prior-art objective lens 22 can be modified (or other optical elements inserted) so that the focus is slightly astigmatic, i.e. the fast axis focal length 314 can be 9.50 mm while the slow axis focal length 212 remains 10 mm. In an alternative embodiment, the fast axis could remain at 10 mm focal length and the slow axis would then need to be extended to 10.5 mm focal length. This astigmatism can be accomplished in any number of ways; six non-limiting examples are provided below.

(i) A separate, discrete, weak cylinder lens can be added to the module either before or immediately following the modified objective lens 303. This could either be a positive cylinder lens oriented in the fast axis or a negative cylinder lens oriented in the slow axis. This technique, while adequate, would not be preferred since it adds two more optical surfaces to the module.

(ii) Assuming that the modified objective lens 303 is plano-convex (spherical or possibly aspherical depending on tolerance to aberrations), the plano surface can be made into a weak cylinder lens. This technique would be straightforward and inexpensive to manufacture using glass-molding technology.

(iii) One of the surfaces of the modified objective lens 303 could be made toroidal, i.e. having slightly different focal powers in the fast and slow axes. Similar to the previous technique, this technique would be straightforward and inexpensive to manufacture using glass-molding technology.

(iv) A standard plano-convex objective lens 303 can be made slightly astigmatic by simply tilting it slightly. The required small amount of astigmatism can typically be achieved by a tilt of a few degrees in the plane of the fast axis. Tilting also induces other aberrations, notably coma, so it would be preferable in this technique to use a lens that is corrected for coma such as an aplanatic asphere.

(v) A tilted plane-parallel plate can be inserted after the modified objective lens 303; the tilt induces an amount of astigmatism that depends on the plate thickness and tilt angle.

(vi) Upstream anamorphic optics (e.g. the slow-axis collimators 18) can be defocused slightly so that the beam 19 entering the modified objective lens 303 is not precisely collimated in one or the other of the axes.

The tilted lens and the tilted plate techniques have a benefit that the astigmatism can easily be varied, so that during the alignment of the system, precise focusing can be achieved in both axes independently—whereas with lenses that have fixed amounts of astigmatism, there is no adjustment with which to null out variations in the alignment or focal power of the fast cylinder lens 302. Of course, it would also be possible to fine-tune the astigmatic lenses by tilting them slightly, an example of combining multiple of the above astigmatism methods.

Figure 4A:
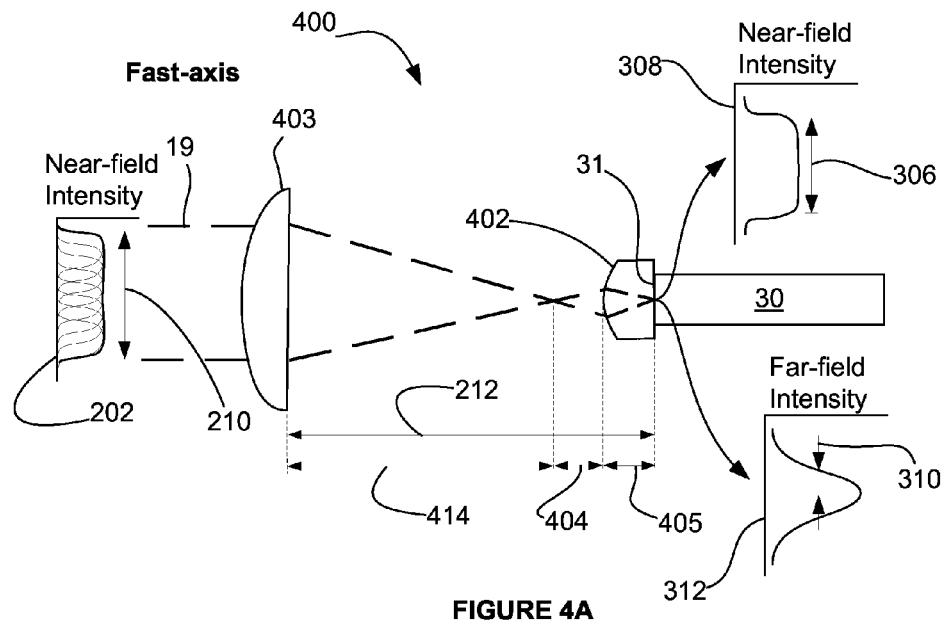
FIG. 4A illustrates another alternate configuration of region B of FIG. 1A in the fast axis according to the present disclosure including graphs of near and far field light intensity distributions at various points.
Figure 4B:
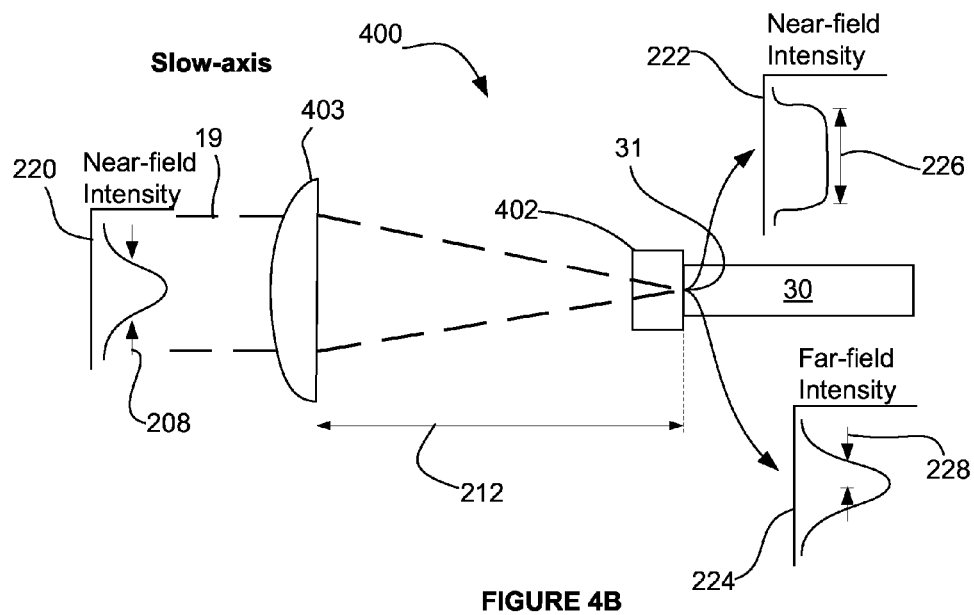
FIG. 4B illustrates the alternate configuration of FIG. 4A in the slow axis including graphs of near and far field light intensity distributions at various points.

Referring now to FIGS. 4A and 4B, a second option 400 is illustrated for introducing a short focal length Fourier transformation in the fast-axis. Instead of inserting an independent fast cylinder lens 302 as in FIGS. 3A and 3B (which introduces two additional optical surfaces), in the second option 400 a solid, coreless endcap 402 with a cylinder-lensed tip is spliced onto the output fiber 30 at the fiber facet 31. The lens of the endcap 402 may have the same optical performance as described with respect to the fast cylinder lens 302 of the first option 300. The distance between the modified objective lens 403 and the front principal surface of the endcap 402 is the sum of the fast-axis focal length 414 of the modified objective lens 403 and the fast-axis focal length 404 of the endcap 402. For optimal performance, the free propagating distance 405 between the front principal surface of the endcap 402 and the fiber facet 31 is equal to the length 405 of the endcap 402 along the light path and this length should be the product of the cylinder-lensed endcap's fast-axis focal length and the refractive index of the material from which the endcap 402 is constructed.

Returning to the numerical example, if the fast-axis focal length 404 of the endcap 402 is again chosen to be 0.25 mm, and the material of the endcap 402 is silica (having refractive index of 1.45 for silica fibers in the near-infrared) then the length of the endcap 402 and distance 405 is 0.25×1.45=0.36 mm. To maintain a slow-axis focal length of 10 mm between the modified objective lens 403 and the fiber facet 31 for comparison purposes, the modified objective lens 403 would require a fast-axis focal length 414 of 9.5 mm and distance 212 would increase to 10.11 mm. The difference between the distance 212 and the slow axis focal length occurs because the beam in the slow axis also experiences refraction as it passes through the endcap. Even though the endcap is 0.36 mm long, the optical length that the slow axis experiences is equivalent to 0.25 mm which is the same as the fast axis. Accordingly, the required astigmatism is again 0.5 mm and the same types of adjustments as describe with respect to the first option 300 may be performed to introduce the 0.50 mm astigmatism in the second option 400. In all other respects, the near and far field intensity distributions of the second option 400 would be the same as those of the first option 300, thus a roughly 2× greater brightness would be achieved over the prior art illustrated in FIGS. 2A and 2B.

Because the illuminated spot incident on the endcap 402 will be of somewhat greater size than the beam spot 36 launched into the core of the fiber 30 at fiber facet 31, the endcap 402 can be of larger diameter than the output fiber 30 as illustrated in FIGS. 4A and 4B. It is common to splice oversized endcaps, such as 250-micron diameter endcaps, onto smaller fibers such as 125-micron outer diameter fibers.

One method of fabricating the fiber 30 and coreless cylinder-tipped endcap 402 is to splice a length of several centimeters of endcap rod onto the fiber and then use CO2-laser machining to cut the endcap rod to the right length and to shape the tip into the desired cylindrical lens (the tip could subsequently be antireflection coated).

The second option 400 has advantages over the first option 300 because the first option 300 introduces new optical surfaces while the second option 400 does not; and because the first options 300 requires that the fast cylinder lens 302 be monolithically attached and aligned with respect to the fiber core 30 while the endcap 402 of the second option 400 can be more easily fabricated with the fiber 30. However, the second option 400 may not be as easily implemented where the laser diode module is not fiber-coupled.

Figure 5A:
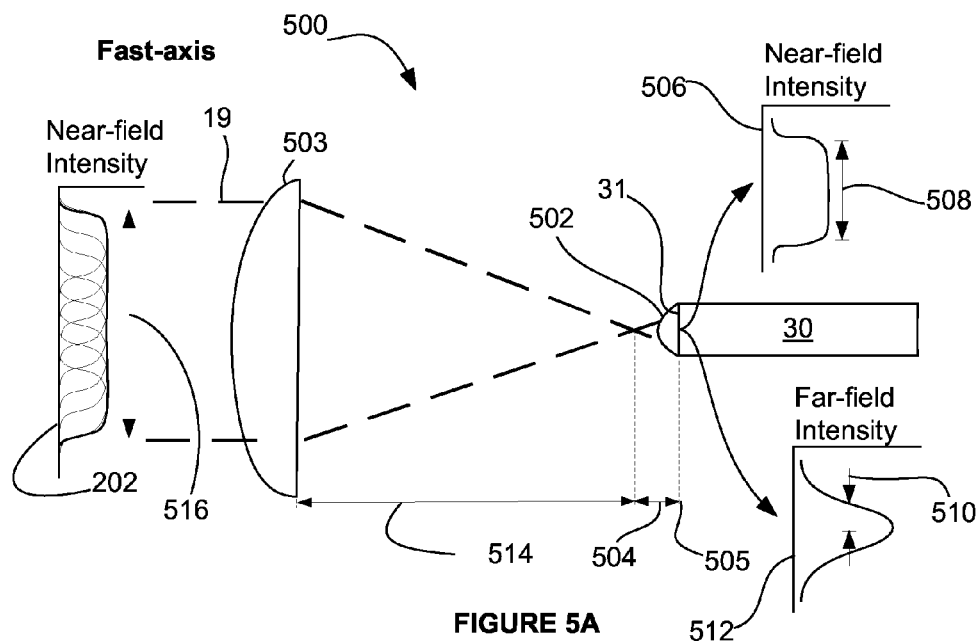
FIG. 5A illustrates yet another alternate configuration of region B of FIG. 1A in the fast axis according to the present disclosure including graphs of near and far field light intensity distributions at various points.
Figure 5B:
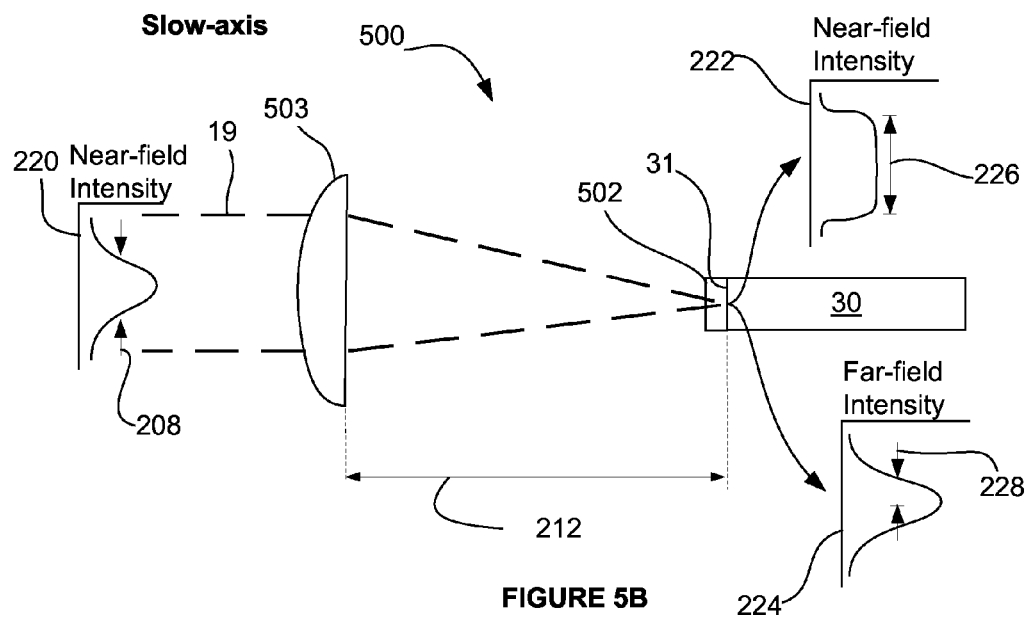
FIG. 5B illustrates the alternate configuration of FIG. 5A in the slow axis including graphs of near and far field light intensity distributions at various points.

Referring now to FIGS. 5A and 5B, both axes of a third option 500 for a fast-axis Fourier transform are illustrated where a fast-axis fast cylinder lens is implemented directly in the fiber tip 502. In some ways, the third option 500 is the simplest, but it involves a slight compromise in performance as well as some additional optical changes. Because the cylinder lens is implemented directly in the fiber tip 502 of the output fiber 30, no endcapping process is necessary and the cylinder-lensed fiber tip 502 can be created directly on top of fiber facet 31 either by laser machining or mechanical polishing. However, doing so removes any distance between the back principle surface of the tip 502 and the fiber facet 31. Because the free propagation distance 505 from the back of the cylinder-lensed fiber tip 502 to the fiber facet 31 is reduced to zero, the third option 500 does not induce a perfect Fourier transform, and it is necessary that the fast-axis focal beam spot 36 from the modified objective lens 503 be made smaller than in the other described options 300, 400 in order to achieve good performance. Similar to the second option 400, it would be difficult to implement this brightness improvement in laser diode modules that are not fiber coupled.

Returning again to the numerical example, if the fast-axis focal beam spot 36 is made smaller by a factor of 2 than the beam spot 36 described in respect of the first and second options 300, 400, then using a cylinder-lensed fiber tip 502 having fast-axis focal length 504 of 0.1 mm, the modified objective lens 502 must have a fast-axis focal length 514 of 9.9 mm to maintain the 10 mm slow-axis focal length of objective lens 503. Distance 212 also remains 10 mm. Accordingly, a near-field top hat distribution 506 having a width 508 of 75 microns and a far field distribution 512 having a half-divergence 510 of 0.075 radians can be achieved. This illustrates that the third option 500 is somewhat inferior to the other two options 300, 400, but still provides a significant improvement over the prior art design 200. In the slow-axis illustrated in FIG. 5B, again, the slow-axis focal length of the modified objective lens 502 remains at 10 mm and the cylinder-lensed fiber tip 502 does not change the slow axis optics.

In this third option, in order to achieve a meaningful brightness improvement over the prior art, the fast-axis spot 36 must be considerably smaller than the spot to which it is being transformed. In numerical modeling it was found that a factor of 2 is sufficient for meaningful improvement.

In order to reduce the fast-axis focal beam spot size by a factor of 2, the beam 19 incident on the modified objective lens 503 can be doubled in fast-axis size 516 to 6 mm while that beam's slow-axis size remains unchanged. This necessitates changes to the fast-axis collimator 16 focal lengths, changes to the pitch at which the emitters are stacked vertically, and increases the susceptibility of the modified objective lens 503 to optical aberrations. It may also be necessary to modify the modified objective lens 503 so it can receive a 6 mm wide beam 19 in the fast-axis. It is also noteworthy that the third option 500 requires astigmatism between the fast axis and the slow axis of only 0.10 mm rather than 0.50 mm from the other two options 300, 400. This smaller amount of astigmatism could be very easy to induce through a slight tilt of the modified objective lens 503.

As indicated above, three options 300, 400, 500 described in FIGS. 3A and 3B, FIGS. 4A and 4B, and FIGS. 5A and 5B respectively are special cases of the general principle where the large, stacked, top-hat-shaped fast axis beam 19 at the entrance to a modified objective lens 303, 403, 503, is demagnified by the combination of a modified objective lens 303, 403, 503 and fast-axis short-focal length transforming lens feature 302, 402, 502 to make a top-hat image that is matched into the beam spot 36 which may be co-located with a fiber facet 31 if the module is fiber-coupled. In some embodiments the fast-axis focal length of the lens features is less than about 3 millimeters. In some embodiments, the fast-axis focal length of the lens feature is between about 0.1 mm and about 2.0 mm.

Optionally, astigmatism may be introduced to the beam 19 such that the fast-axis focal point from the objective lens aligns with the upstream fast-axis focal point of the fast axis Fourier transforming feature while the slow-axis focal point from the objective lens aligns with the beam spot. However, astigmatism is not necessary in all embodiments. For example, the lens feature may be a 2D gradient-index lens or a spherically polished endcap, which do not require astigmatism to perform a short focal length fast-axis Fourier transform. In these cases, the slow axis is transformed along with the fast axis, which may be acceptable or desirable in certain optical designs.

The fast axis Fourier lens feature may remove the astigmatism such that the fast and slow axis focal points are the same. In some embodiments additional features are added to remove astigmatism after the additional Fourier transform.

In the embodiments of the present disclosure, many different lens types are available and can be applied to effect the additional Fourier transform in the fast-axis, including aspheric cylinders, toroidal lenses, spherical lenses, aspherical lenses, axial-gradient-index lenses, and transverse-gradient-index lenses.

In yet further embodiments of the present disclosure, the short-focal length lens (which introduces the additional fast-axis Fourier transform) may be a graded-index lens (GRIN), independently secured as cylindrical lens 302 or fabricated as a graded-index-core fiber of which a short segment can be fusion-spliced onto the tip of the fiber 30.

A one-dimensional GRIN lens could be very effective as the short-focal length lens: such a lens will have a precise parabolic index gradient (in order for a GRIN lens to have minimal aberrations) in one axis, and zero gradient in the other axis. However, it is challenging to fabricate such an optic with truly no gradient in the other axis and/or fabricate such an optic as an exteriorly round fiber segment to be fusion-spliced onto a fiber.

A modified two-dimensional GRIN lens could also be used as the short-focal length lens. Such a lens could be designed to be Fourier-transforming in the fast axis and imaging, or nearly imaging, in the slow axis, by adjusting the focal strengths in the two axes.

Referring back to FIG. 1B, the resulting focal beam spot 36 at the fiber facet 31 generally has a square or rectangular shape rather than a circular or strongly rounded shape. This is especially true if any of the three options described above using a fast cylinder lens is applied to the laser diode module 10 because these options create very sharp-edged and uniformly-filled square or rectangular focal beam spots 36 (75× 75 micron, using the numerical example). Therefore, in order best to maintain brightness, it is desirable to use a core shape that is well-matched to the illuminated spot 36, which in the various options discussed above would be square or rectangular. This additional design change may result in up to about two times increase in brightness in addition to the two times increase in brightness effected by the additional Fourier transform.

Figure 6A:
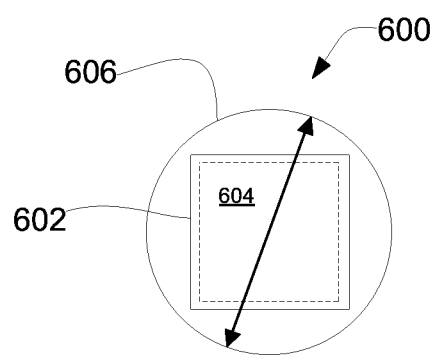
FIG. 6A is a cross-sectional end view of a fiber according to the present disclosure.

Referring now to FIG. 6A, a fiber 600 is illustrated. The core 602 size could be 75×75 microns to match the focal beam spot size 604, or it could be made slightly larger in order to account for aberrations and manufacturing deviations. The cladding 606 of the fiber 600 may be circular with a diameter sufficient to surround the core 602 as illustrated in FIG. 6A or any other shape, including square or rectangular to uniformly circumscribe the core 602.

Figure 6B:
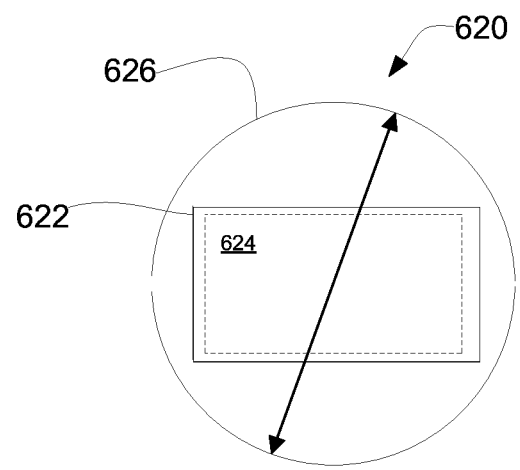
FIG. 6B is a cross-sectional end view of another fiber according the present disclosure.

In another embodiment illustrated in FIG. 6B, a fiber 620 is illustrated having a non-square rectangular shaped core 622, such as 75×150 microns. Cladding 626 may be similar in nature to cladding 606. This shape of fiber 620 provides an extra degree of design freedom, effectively decoupling the fast and slow axes from their prior design constraints. For example, core 622 allows the use of 2× wider emitters 12, thus providing higher output power, without altering the number of emitters, their vertical pitch, or the rest of the optical design.

Square-core or rectangular-core fibers 600, 620 are relatively difficult to fabricate, although it is certainly possible. To date, they have seen significant use only in laser-delivery fibers, where it is desired to have a square or rectangular laser spot projected onto a work-piece to give more uniform illumination for materials processing. The potential applicability to brightness enhancement in fiber-coupled multi-emitter laser diode modules has not, to Applicants' knowledge, been commercialized elsewhere.

Figure 1B:
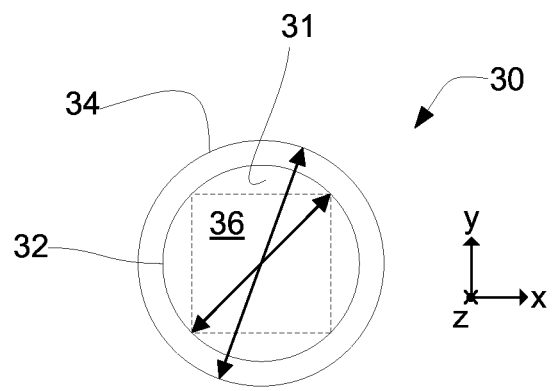
FIG. 1B is an exploded cross-sectional end view of the fiber facet 31 of FIG. 1A taken along the line A.

Using a 75×75 micron square core 602 results in 1.54× higher brightness than the brightness of a 75×75 micron spot 36 in a 105-micron circular core fiber 30 as in FIG. 1B because the area fill is only 65% of the circular core. A 75×150 micron spot 624 would barely fit into a 168-micron circular core, such that using the rectangular core 624 would result in 1.96× higher brightness. Coupling these brightness improvements with the approximately 2× improvement predicted using any implementation of the first design change (an additional fast-axis Fourier transform) gives a total improvement in brightness of a factor of approximately 3-4, which is very substantial and can be achieved for very little added cost.

In some embodiments of the present disclosure, dichroic coatings and slanted fiber gratings as specified in previously identified U.S. Pat. No. 7,764,723 may also be applied to other optical surfaces disclosed herein than merely those specified in the '723 patent.

In some embodiments, the typical number of emitters 12 would be six or seven, with the possibility of more. In some embodiments, multiple sets of emitters 12 may be combined by another set of mirrors with the polarization of the stacked light beams rotated 90 degrees by, for example, a half-wave plate or polarization rotator. This rotated beam may then be merged into beam 19 by a polarizer located immediately in front of any of the modified objective lenses 303, 403, 503.

Figure 7:
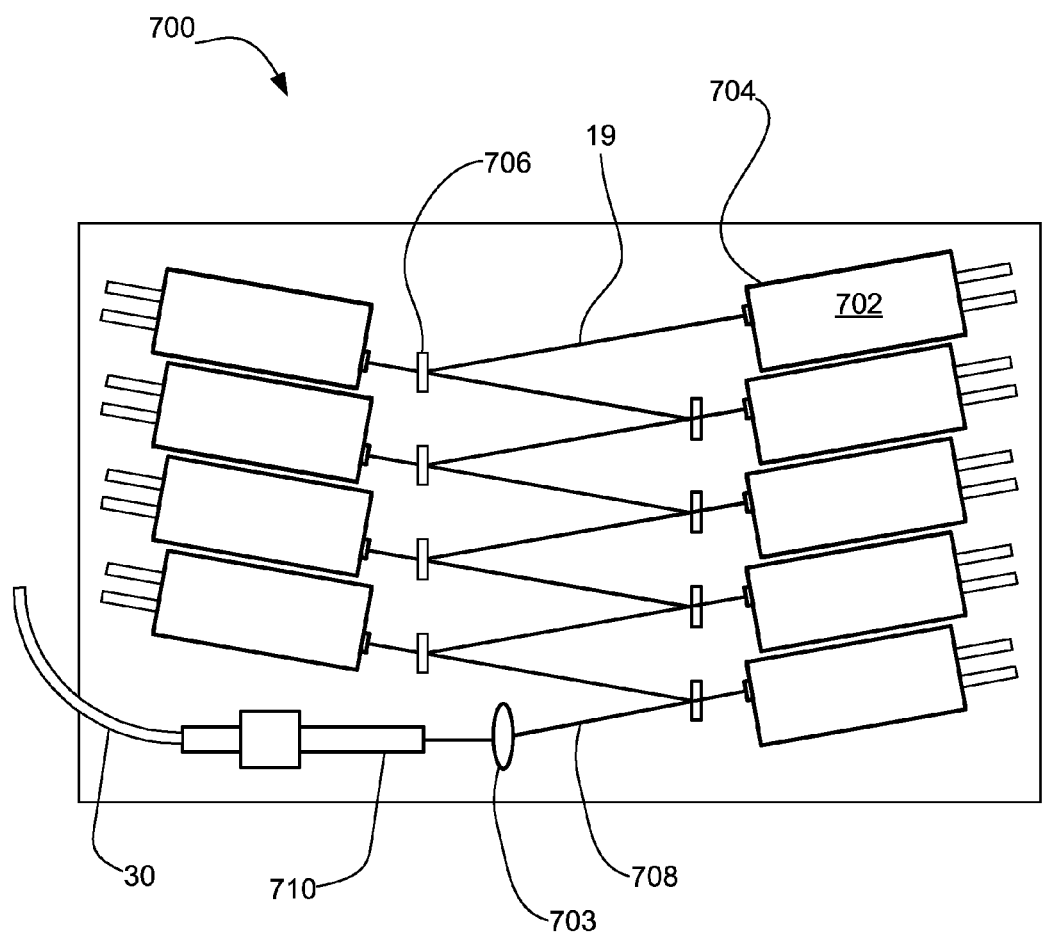
FIG. 7 illustrates a fiber coupled system combining several multi-emitter diode modules according to the present disclosure.

In yet further embodiments, spectral combining is also performed on the light before launching into the fiber 30. This is illustrated in FIG. 7. System 700 contains an arrangement of multi-emitter modules 702 that are not fiber coupled. Each module 702 contains a plurality of laser diodes that are spatially and polarization-multiplexed into one collimated beam. For example, there may be 12 laser diodes in some of the modules 702. Each module 702 is constructed according to any of the previously described embodiments of this disclosure that are not fiber coupled, with the following differences. The focusing or objective lens 22, 303, 403, 503 and fiber 30 of each module 702 has been removed and replaced by a simple window 704, so that the collimated beam 19 emerges from each module 702. Each module 702 emits a collimated beam 19 having a slightly different wavelength than any of the other modules 702 in the system 700. The collimated beam 19 of each module 702, except the first module, is incident to an adjacent dichroic mirror 706. Each dichroic mirror 706 is chosen to transmit the wavelengths of its adjacent module 702 and reflect other wavelengths of light. The modules 702 and dichroic mirrors 706 are arranged such that the collimated beam 19 from the previous module 702 reflects off the dichroic mirror associated with the next module 702 along the same path as the collimated beam 19 emitted by the next module 702. Accordingly, the different wavelength collimated beams 19 from each module 702 are successively combined together into a spectrally-combined beam 708. The spectrally-combined beam 708 arrives at the final focus lens 703 and is focused into a fiber 30 through a connector 710. Obviously, this is just one example of many schemes for spectrally combining the beams. Other schemes would include the use of diffraction gratings, volume phase gratings, other arrangements of dichroic mirrors, additional lenses between mirrors, etc. as is known in the art. Also the steps of spatial combining, polarization combining, and spectral combining could be done in different sequences. Furthermore, the optics may be separated into any number of modules, each having any number of emitters apiece. For example, instead of 9 modules 702 each having 12 laser diode emitters, all 108 emitters could be directly mounted onto one large coldplate.

Figure 8A:
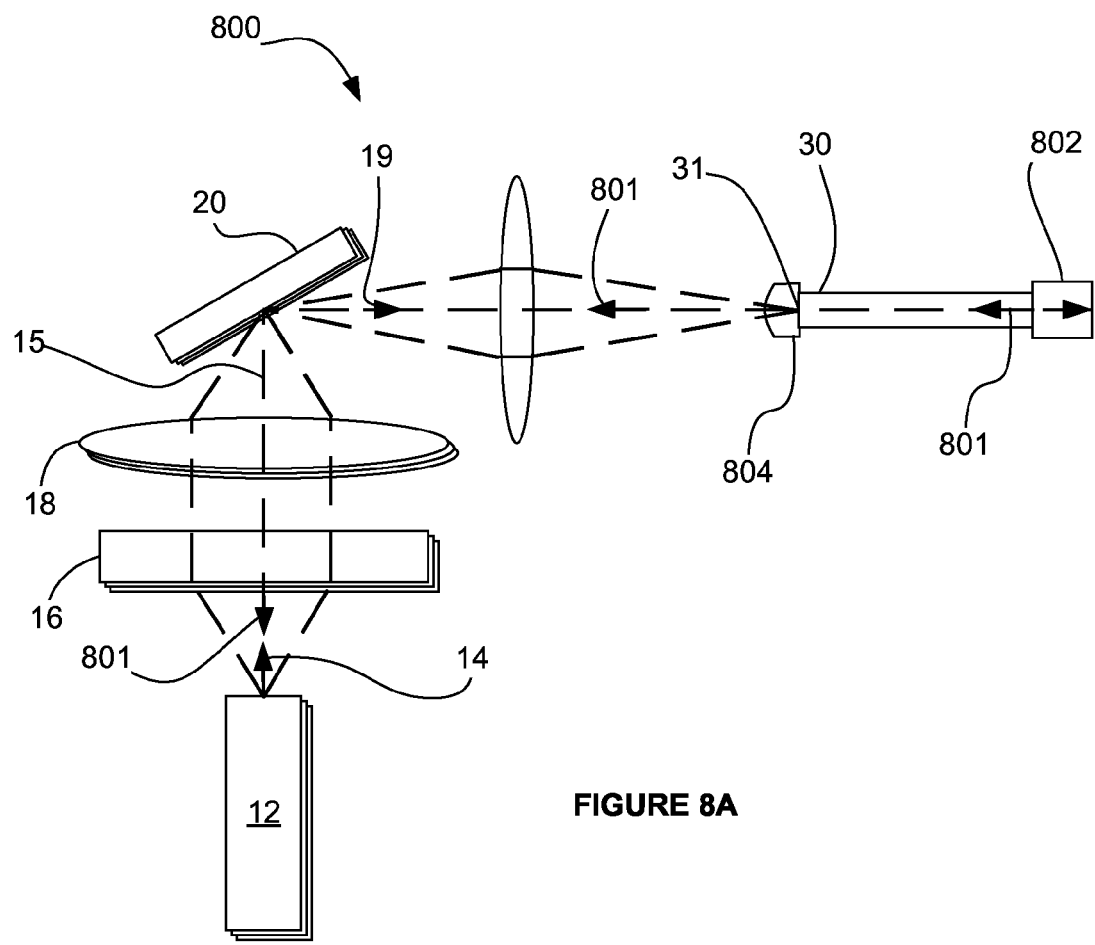
FIG. 8A is a perspective schematic illustration of a fiber-coupled multi-emitter laser diode module according to the present disclosure for providing feedback to the module.
Figure 8B:
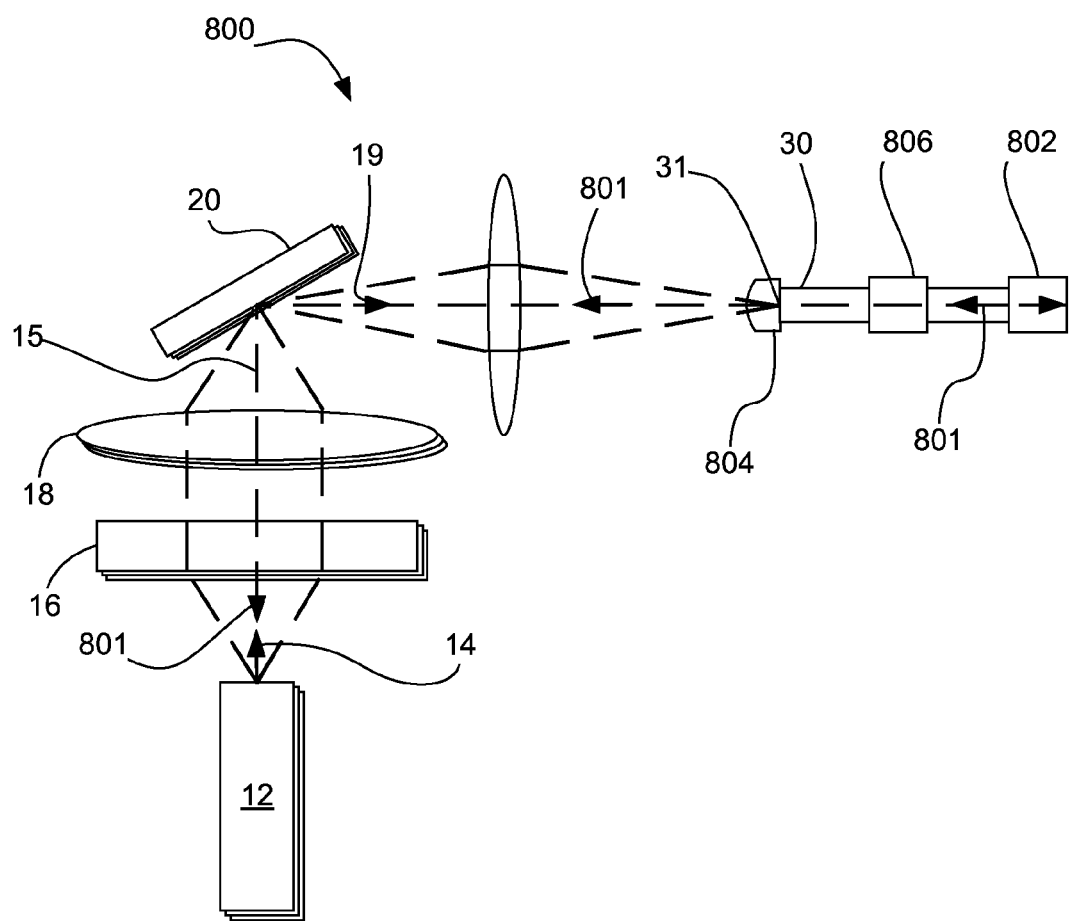
FIG. 8B illustrates a perspective schematic illustration of a fiber-coupled multi-emitter laser diode module according to the present disclosure for providing wavelength selective feedback to the module for wavelength locking.

Referring now to FIGS. 8A and 8B, example embodiments for providing feedback in a fiber-coupled multi-emitter module 800 are illustrated. As described in the various laser diode module embodiments above, a short-focal-length lens feature within a multi-emitter module improves the brightness efficiency of the module in the forward direction. This improvement correspondingly improves the backward power efficiency. In FIGS. 8A and 8B, this feedback improvement is illustrated in fiber coupled laser diode modules; however it can also be achieved with any of the multi-emitter diode modules described in this disclosure. A further improvement achieved in these embodiments is a more even distribution of feedback to all of the emitters in the fiber-coupled multi-emitter module.

In FIG. 8A, feedback 801 to the emitters 12 of a fiber-coupled multi-emitter module 800 is provided using a reflector 802 downstream of the fiber facet 36. The reflector 802 reflects at least one portion of the light beam 19 as feedback 801 back to the emitters 12 and may allow a second portion of the light beam 19 to exit the multi-emitter module 800 as an output beam. The reflector 802 may comprise a high reflector, a partially reflective reflector, a patterned reflector, a scraper-mirror reflector, a wavelength-dependent reflector, or multiple reflectors including any of these reflector types. The reflector 802 may be formed within the fiber 30, within another fiber connected to fiber 30 or downstream of fiber 30. In some embodiments, the reflector 802 is wavelength-selective or the reflector 802 comprises a reflector downstream of an wavelength selective optical element. In FIG. 8A, the short-focal-length fast-axis lens feature 804 is adjacent to the fiber entrance facet 31 and illustrated as an endcap connected to the tip of fiber 30; however, any of the other lens feature configurations described in other embodiments may also be used.

The feedback performance of the system of FIG. 8A surpasses that possible using prior art in two ways. First, as described above, the short-focal-length lens feature 804 improves the brightness efficiency of the system in the forward direction, correspondingly improving the backward power efficiency. If an improvement in brightness of 2× is achieved using any of the short-focal-length lens feature options described above, then the feedback efficiency is improved by 2× as well.

Second, it has been found that the feedback signal 801 is dispersed more evenly to all of the emitters 12 by the short-focal-length lens feature 804. More even distribution of the feedback signal 801 requires less power or brightness efficiency in the feedback signal 801 to provide sufficient feedback to the weakest-coupled emitter. In numerical simulations of a system providing feedback signal to seven 100-micron-wide emitters, it was found that without a short-focal-length lens feature 804, the weakest-coupled emitter received about 30% as much feedback power as the strongest-coupled emitter; using the short-focal-length lens feature 804, the weakest-coupled emitter received 72% as much feedback as the strongest-coupled emitter. Accordingly, the system illustrated in FIG. 8A provides a more evenly dispersed external feedback signal 801 across all of the emitters 12.

In some embodiments, the desired levels of such feedback signal 801 are generally at least 1% of the light beam 19 in order to discriminate strongly against residual reflections on the order of 0.01%-0.1% from the diode facet and other optics. In some embodiments, the percentage of light 19 reflected back in the feedback signal 801 by the reflector 802 is in the range of 5-20%.

When feedback to the multi-emitter module 800 is used for wavelength locking, the reflected feedback signal 801 must be spectrally selective. This spectral selectivity is typically achieved in one of two ways: the reflector 802 can be made wavelength-dependent, or wavelength-dependent optics may be inserted upstream of the reflector 802.

Where the reflector 802 is wavelength-dependent, the reflector generally has maximum reflectivity at a desired emitter operating wavelength. Embodiments of a wavelength-dependent reflector include a fiber Bragg grating embedded in the fiber 30 or in another downstream fiber, a suitably designed thin-film filter, a Fabry-Perot etalon, a reflective diffraction grating in the Littrow configuration, a reflective volume holographic grating, or any other wavelength-dependent reflector located in free space at or beyond the distal end of the fiber 30.

FIG. 8B illustrates the system of FIG. 8A further including a wavelength-dependent optical element 806 used in conjunction with a reflector 802 to provide wavelength selective feedback. The wavelength-dependent optical element 806 is inserted into the beam path upstream of the reflector 802 and downstream of the fiber entrance facet 31. The wavelength-dependent optical element 806 causes the wavelengths of the beams 19 from the emitters 12 to be locked at a desired wavelength. The wavelength-dependent optical element serves to separate one or more wavelengths of light from the beams whereafter the separated wavelength is incident on the reflector 802. In some embodiments, the wavelength-dependent optic 806 may comprise a thin-film filter, Fabry-Perot etalon, diffraction gratings, volume holographic gratings, a prism or combinations of those optics.

Where examples, alternative embodiments and additional aspects of those embodiments have been described in the present disclosure, those examples embodiments and aspects may be combined in any manner within a single embodiment unless the present disclosure suggests otherwise. Where axis directions and orientations such as vertical and horizontal have been specified, it is understood that the orientation of these orthogonal directions may be modified within embodiments of the present disclosure.

The values provided in the numerical examples are only a few examples of how the present disclosure may be implemented. The specific values provided were selected to enable ready comparison of the prior art and different embodiments of the present disclosure to demonstrate the invention. The specific values in the numerical examples should not be considered limiting.

I claim:

1. An apparatus comprising:
a plurality of laser diode emitters, each emitter for emitting a broad-area light beam in a beam direction, each beam having a fast axis transverse to the beam direction and a slow axis transverse to both the beam direction and the fast axis, each beam being broad in the slow axis and narrow in the fast axis;
a group of optical components for each emitter for collimating, shaping, stacking and directing the beams along a light path towards a beam spot, each group aligned downstream on the beam direction of the group's associated emitter; and
a lens feature aligned on the light path downstream of the groups of optical components and upstream of the beam spot, the lens feature having a fast axis focal length less than about 3 millimeters,
wherein the lens feature is arranged to perform a fast-axis Fourier transform of the beams such that the edges of a fast axis near-field intensity distribution of the beams at the beam spot increase in steepness.

2. The apparatus of claim 1, wherein the lens feature is selected from the group comprising:
i) a fast-axis cylinder lens,
ii) an aspheric cylinder lens,
iii) a toroidal lens,
iv) a spherical lens,
v) an aspherical lens, and
vi) a transverse-gradient-index lens.

3. The apparatus of claim 1, wherein the fast axis focal length of the lens feature is between about 0.1 millimeters and about 2.0 millimeters.

4. The apparatus of claim 1, wherein the lens feature forms a solid coreless endcap coupled to a fiber at the beam spot.

5. The apparatus of claim 1, wherein the lens feature forms part of a tip of a fiber coupled to the apparatus at the beam spot.

6. The apparatus of claim 1 further comprising an objective lens aligned on the light path downstream of the groups of optical components.

7. The apparatus of claim 1 wherein the group of optical components for each emitter comprises a fast axis collimator, a slow axis collimator and a bending mirror.

8. The apparatus of claim 1 further comprising an optical fiber, a fiber tip thereof disposed at the beam spot for receiving the beams.

9. The apparatus of claim 8 wherein the optical fiber comprises a core having a rectangular cross-section transverse to the light path.

10. The apparatus of claim 8 further comprising a reflector aligned on the light path downstream of the fiber tip for reflecting a portion of the beams back to the emitters.

11. The apparatus of claim 10 wherein the reflector comprises a wavelength-dependent reflector.

12. The apparatus of claim 11 wherein the wavelength-dependent reflector is selected from the group comprising: a fiber Bragg grating, a thin-film filter, a Fabry-Perot etalon, a diffraction grating, and a volume holographic grating.

13. The apparatus of claim 10, further comprising a wavelength-dependent optical element aligned on the light path between the fiber tip and the reflector, the wavelength-dependent optical element for separating one or more wavelengths of light from the beams.

14. The apparatus of claim 13, wherein the wavelength-dependent optical element is selected from the group comprising a thin-film filter, a Fabry-Perot etalon, a diffraction grating, a volume holographic grating, and a prism.

15. An apparatus comprising:
- a plurality of laser diode emitters, each emitter for emitting a broad-area light beam in a beam direction, each beam having a fast axis transverse to the beam direction and a slow axis transverse to both the beam direction and the fast axis, each beam being broad in the slow axis and narrow in the fast axis;
- a group of optical components for each emitter for collimating, shaping, stacking and directing the beams along a light path towards a beam spot, each group aligned downstream on the beam direction of the group's associated emitter;
- a lens feature aligned on the light path downstream of the groups of optical components and upstream of the beam spot, the lens feature having a fast axis focal length less than about 3 millimeters; and
- means for creating astigmatism between the fast axis and the slow axis in the beams upstream of the lens feature in accordance with the fast axis focal length of the lens feature.

16. The apparatus of claim 15, wherein the means for creating astigmatism is selected from the group comprising one of:
  i) a weak cylinder lens upstream of the lens feature,
  ii) a weak cylinder lens formed on a downstream surface of an objective lens aligned on the light path downstream of the groups of optical components and upstream of the lens feature,
  iii) a toroidal surface of an objective lens aligned on the light path downstream of the groups of optical components and upstream of the lens feature,
  iv) a slight tilting of an objective lens in the plane of the fast axis, the objective lens aligned on the light path downstream of the groups of optical components and upstream of the lens feature;
  v) a tilted plate parallel to the plane of the fast axis, and
  vi) anamorphic optics in the group of optical components for each emitter being defocused such that the collimation of each light beam is different between the fast axis and the slow axis.

17. The apparatus of claim 15 wherein the lens feature reduces astigmatism introduced by the astigmatism means by refocusing the fast axis focal point on the beam spot.

18. A method for increasing the brightness of a multi-emitter laser diode module, the method comprising:
- emitting a broad-area light beam from each of a plurality of laser emitters, each beam travelling in a beam direction, each beam having a fast axis transverse to the beam direction and a slow axis transverse to both the beam direction and the fast axis, each beam being broad in the slow axis and narrow in the fast axis;
- collimating and shaping the beams;
- stacking the beams in the fast axis;
- directing the beams along a light path towards a downstream beam spot;
- after collimating, stacking and directing the beams, Fourier transforming the beams in the fast-axis through a lens feature having a fast-axis focal length less than about 3 millimeters.

19. The method of claim 18 wherein Fourier transforming the beams further comprises increasing the steepness of the edges of a fast axis near-field intensity distribution of the beams at the beam spot.

20. The method of claim 18, further comprising providing the fast axis focal length of the lens feature between about 0.1 millimeters and about 2.0 millimeters.

21. The method of claim 18 further comprising:
- introducing astigmatism to the beams prior to Fourier transforming such that a fast axis focal point of the beams is located relative to the lens feature; and
- reducing astigmatism during or after the fast-axis Fourier transforming by re-focusing the fast axis focal point on the beam spot.

22. The method of claim 21, wherein introducing astigmatism further comprises focusing the slow axis focal point on the beam spot.

23. The method of claim 18 further comprising coupling an optical fiber at the beam spot and wherein focusing on a beam spot comprises focusing into a fiber tip of the optical fiber.

24. The method of claim 23 further comprising providing the optical fiber with a core having a rectangular cross-section transverse to the beam direction.

25. The method of claim 23 further comprising reflecting a portion of the beams from downstream of the fiber tip back to the emitters.

26. The method of claim 23 further comprising reflecting a portion of a selected wavelength of the beams from downstream of the fiber tip back to the emitters.

* * * * *